(12) United States Patent
Chen et al.

(10) Patent No.: US 8,680,663 B2
(45) Date of Patent: Mar. 25, 2014

(54) METHODS AND APPARATUS FOR PACKAGE ON PACKAGE DEVICES WITH REDUCED STRAIN

(75) Inventors: Yu-Feng Chen, Hsin-Chu (TW); Han-Ping Pu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 13/342,751

(22) Filed: Jan. 3, 2012

(65) Prior Publication Data

US 2013/0168855 A1 Jul. 4, 2013

(51) Int. Cl.
*H01L 23/02* (2006.01)

(52) U.S. Cl.
USPC ............. 257/678; 257/98; 257/677; 257/679; 257/738; 257/E23.024

(58) Field of Classification Search
USPC ............. 257/E23.024, 738, 98, 678–679, 700
See application file for complete search history.

(56) References Cited

U.S. PATENT DOCUMENTS

2006/0197209 A1* 9/2006 Choi et al. ............... 257/686
2009/0032969 A1* 2/2009 Pilla ............... 257/777

* cited by examiner

*Primary Examiner* — Elias M Ullah
(74) *Attorney, Agent, or Firm* — Slater & Matsil, L.L.P.

(57) ABSTRACT

Methods and apparatus for package on package structures. A structure includes a first integrated circuit package including at least one integrated circuit device mounted on a first substrate, a plurality of package on package connectors extending from a bottom surface and arranged in a pattern of one or more rows proximal to an outer periphery of the first substrate; and a second integrated circuit package including at least another integrated circuit device mounted on a second substrate and a plurality of lands on an upper surface coupled to the plurality of package on package connectors, and a plurality of external connectors extending from a bottom surface of the second substrate; wherein the pattern of the external connectors is staggered from the pattern of the package on package connectors so that the package on package connectors are not in vertical alignment with the external connectors. Methods for forming structures are disclosed.

20 Claims, 9 Drawing Sheets

_METHODS AND APPARATUS FOR PACKAGE ON PACKAGE DEVICES WITH REDUCED STRAIN_

BACKGROUND

As devices manufactured using integrated circuits continue to shrink, the need for smaller packages for the integrated circuit devices continues to increase. One approach increasingly used to save space on a system circuit board and to reduce the board area used is to provide two or more integrated circuits in a combined, vertically arranged package structure called a "Package on Package" or "PoP" device. The PoP structure reduces the board area needed and also eliminates the need for some of the connector traces on the circuit board that would otherwise connect the devices to each other. Through via connections may be used to provide electrical connections between the vertically arranged packaged devices.

For example, a memory module may be the device in an upper package in a PoP structure. The memory module could include one, two or more commodity memory devices such as DDR DRAM, or FLASH devices, as non-limiting examples. The upper package substrate may be a multiple level circuit board, and may be formed of a resin, such as epoxy glass resin, FR4, BT resin, ceramic, plastic, film, or other substrate materials including those with fiberglass cores in a resin material.

The bottom surface of the upper substrate may have one or more rows of PoP connectors extending vertically away from the bottom surface of the top substrate. These PoP connectors provide the connections to either the integrated circuit mounted on the bottom package of the PoP device, or, to connections that will be mapped to the system board when the PoP device is finally mounted on the system circuit board.

The bottom package is a substrate that also has at least one integrated circuit mounted on it. This integrated circuit may be an ASIC, microprocessor, microcontroller, or the like. The upper surface of the bottom package has lands or pads for receiving and electrically connecting to the PoP connectors. For example, if the PoP connectors are rows of solder balls extending from the bottom surface of the upper package, lands or pads on the upper surface of the bottom package will correspond to, and receive, those connectors.

The bottom substrate of the PoP will also have external connectors for making the final connection between the PoP structure and the system circuit board. The bottom package may be a ball grid array ("BGA") type package and have solder balls arranged in an array on the bottom surface. Thus the PoP device has connector terminals between the top substrate and the bottom substrate, and, connector terminals extending from the bottom substrate that are mounted on pads on a system circuit board. During thermal cycling tests, ball strain has been observed in PoP packages. This ball strain can cause the connector terminals, such as solder balls, to crack or lift off of the conductive pads, creating defects or circuit failures. As the substrates used in the PoP devices are increasingly becoming thinner, and more package warpage is observed due to thermal effects, the observed ball strain is increasing.

BRIEF DESCRIPTION OF THE FIGURES

For a more complete understanding of the present disclosure, and the advantages thereof, reference is now made to the following descriptions taken in conjunction with the accompanying drawings, in which.

The drawings, schematics and diagrams are illustrative and not intended to be limiting, but are examples of embodiments of the disclosure, are simplified for explanatory purposes, and are not drawn to scale.

DETAILED DESCRIPTION

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed concepts of the application, and do not limit the scope of the disclosure and do not limit the scope of the appended claims.

Embodiments of the present application, examples of which are now described in detail, provide novel methods and apparatus for PoP structures with reduced strain in the external connectors. In one approach, the embodiments provide external connectors for the system board connections in a pattern that is staggered from, and not in alignment with, any of the overlying PoP connectors that connect the upper package of the PoP structure to the bottom package of the PoP structure. This approach may also be used with PoP structures that include a molded underfill (MUF) between the upper and bottom packages to form additional embodiments. In other embodiments, a PoP structure is provided with an array of external connectors disposed underneath the bottom package of the PoP structure for connecting to a system board, the array of connectors being depopulated in the corner locations, and PoP connectors overlying the bottom package for connecting to the top package. In these embodiments the PoP connectors may be in alignment with the external connectors, and the corner PoP connectors may be in alignment with the voids created by the depopulated locations in the external connector array pattern. Each of the embodiments has been shown to reduce the connector strain observed during thermal cycle testing of the PoP structures when compared to the prior known approaches for the same package size, connector counts, and materials. In drop tests, the use of the embodiments improves the results obtained for the PoP structures over the results obtained for the equivalent prior art structures.

Figure 1:
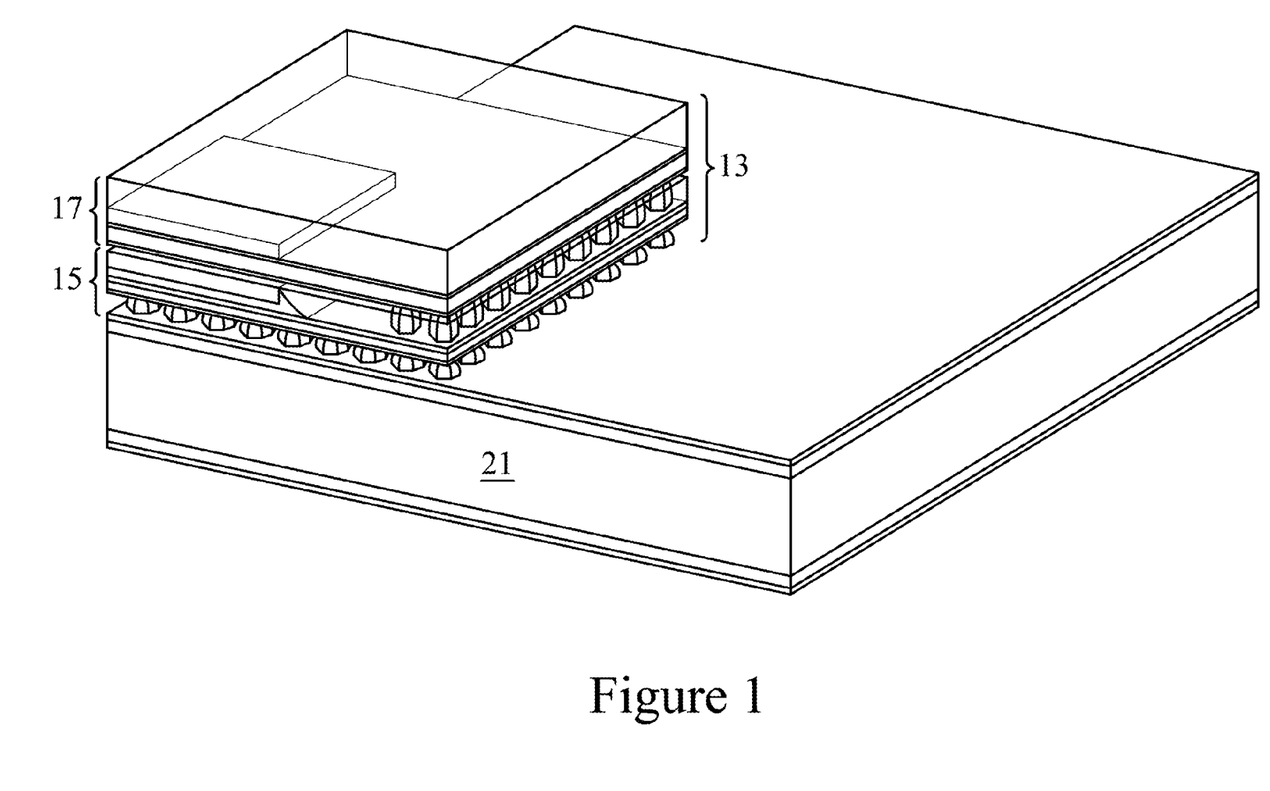
FIG. 1 depicts in a three dimensional view a section of a printed circuit board with a PoP device mounted thereon.

FIG. 1 depicts, in a three dimensional view, a quarter section of a conventional PoP structure 13 that includes a ball grid array ("BGA") package 15 as the bottom package; and an upper package 17 mounted over the BGA package in a PoP structure. External connectors extending from the bottom surface of the upper package 17 in FIG. 1 connect to lands or pads on the upper surface of the BGA package 15. The embodiments described in this application have connectors extending from the bottom of the upper package to lands on the upper surface of the bottom package of the PoP structures. In some embodiments these connectors may be formed as solder balls. However, the embodiments and the various applications for the embodiments are not so limited. Copper connectors, such as copper columns, pillars, or studs, controlled collapse chip connectors ("C4"), copper or solder bumps, and columns of other conductive material may all be used instead of, or along with, the solder balls shown as the example connectors in the figures. Further, the term "solder" as used herein includes both lead containing and lead-free solders. Lead containing solders such as Pb/Sn compositions, and lead-free solders including without limiting the embodiments SnAgCu ("SAC") compositions for example, are within the term "solder", which also includes other solder compositions such as eutectics. Various platings and coatings may be used to improve the solderability, improve adhesion, improve reflow processes or improve other characteristics of the connectors. All of these variations are contemplated as alternative embodiments of the embodiments discussed herein, and these alternatives also fall within the scope of the appended claims In FIG. 1, the PoP structure 13 is mounted on a system board 21. System board 21 may be, for example, a printed circuit board. The PoP structure may be mounted using the ball connectors to couple to lands on the system board 21 in a thermal reflow process. In the reflow process the BGA balls are first placed in alignment with the lands on the substrate 21 which are formed in a correspondence to the BGA balls, the PoP structure is moved to put the BGA balls in contact with the lands on the circuit board 21, and a thermal process is used to cause the BGA balls to melt and reflow and mechanically bond with the circuit board, completing both an electrical and a mechanical connection of the PoP structure to the circuit board. Adhesives may be used to further add mechanical strength, and underfill materials may be used to provide stress relief to the connection between the PoP structure 13 and the circuit board 21.

Figure 2:
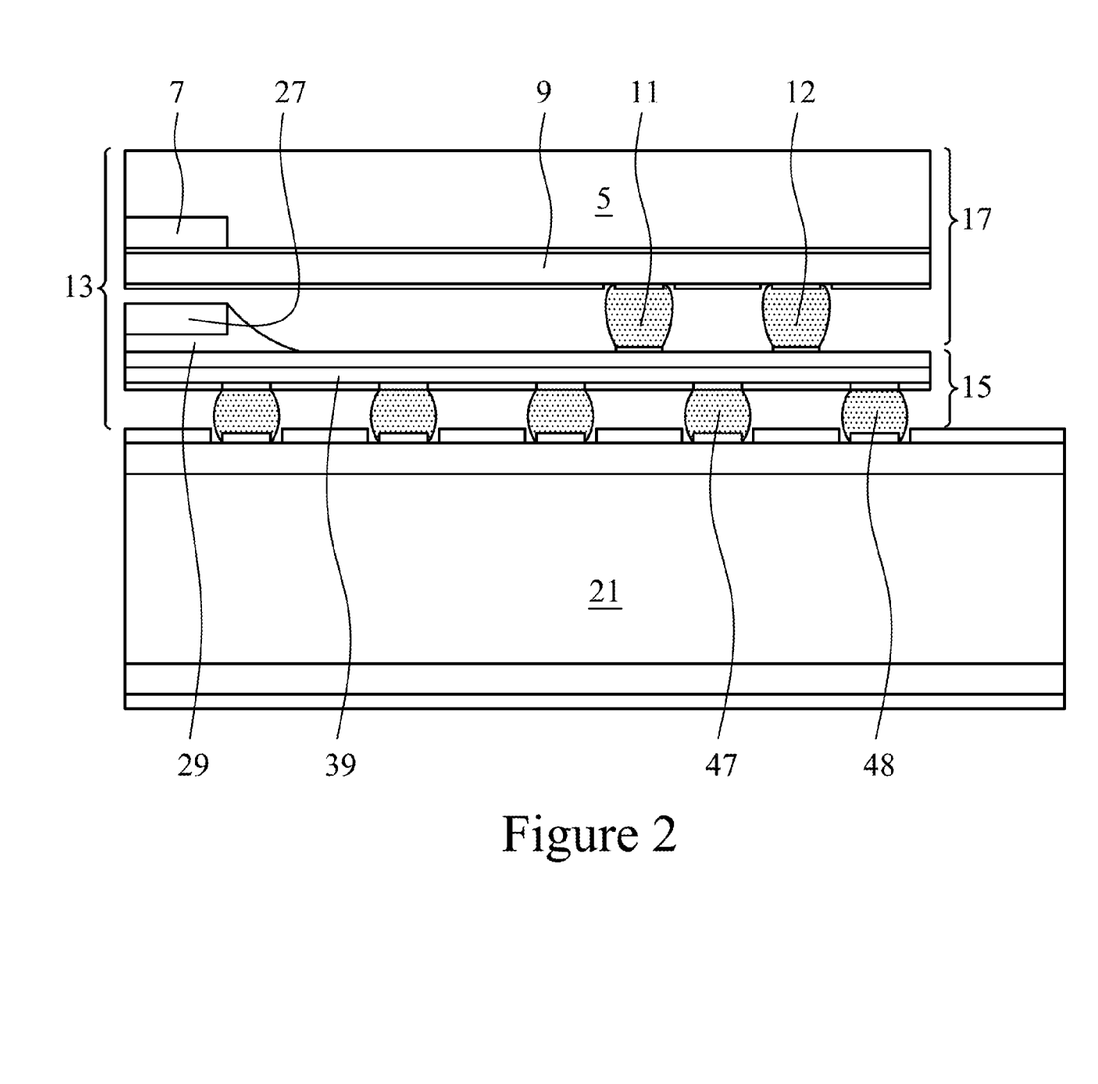
FIG. 2 depicts in a cross-sectional view an embodiment PoP structure.

The embodiments of this application provide novel PoP structures that reduce the strain in the external connectors. FIG. 2 depicts, in a cross sectional view, a first example embodiment. In FIG. 2, the connectors (for example, solder balls 11 and 12) that extend from the bottom of the upper package 17 are no longer in alignment with the external connectors (again, as shown in the example here, these may be solder balls) 47, 48 that extend from the bottom substrate 39 of package 15, here substrate 39 is a silicon interposer, to the circuit board 21. The BGA connectors 47, 48 on the bottom surface of the substrate 39 are now staggered from the connectors 11 and 12 and spaced apart from the connectors on the upper surface of the substrate 3. Also, the outermost row of the BGA connectors 48 lies outside the area of the outermost row of the PoP connectors, for example connector 12.

The staggered pattern may be achieved by providing the rows 11 and 12 of the PoP connectors with a uniform spacing, and using the same spacing for the external connectors 47, 48, but displacing the connectors 47 and 48 by an offset spacing so that the external connectors are disposed between, and not aligned with, the overlying PoP connectors. The offset could be a half pitch distance offset. In an alternative, the external connectors, which may be arranged in a ball grid array pattern, may be left in their original positions, and the PoP connectors may be arranged with the same spacing or ball pitch distance, but moved inward by a half pitch offset to produce the same spacing as shown in FIG. 2.

The embodiment of FIG. 2 has been shown to exhibit substantially reduced connector strain during thermal cycle testing ("TCT"). When the embodiment of FIG. 2 is used in comparison to a conventional alignment PoP arrangement, the maximum ball strain observed is reduced by approximately 25% over the conventional approach. This significant improvement is obtained without any change in the ball count, or any other modifications to the PoP structure.

In FIG. 2, a capillary underfill 29 may be used to provide protection, and stress relief, to the integrated circuit 27. Integrated circuit 27 may be a "flip chip" mounted device that is electrically coupled to pads (not visible in the figures) on the upper surface of the silicon interposer substrate 39. The use of a capillary underfill 29 provides protection for the flip chip connections (not shown). The underfill may be a resin, epoxy, or the like. After it is dispensed and flows under the integrated circuit 27, the underfill 29 may be cured using thermal curing, or, UV curing.

Figure 3:
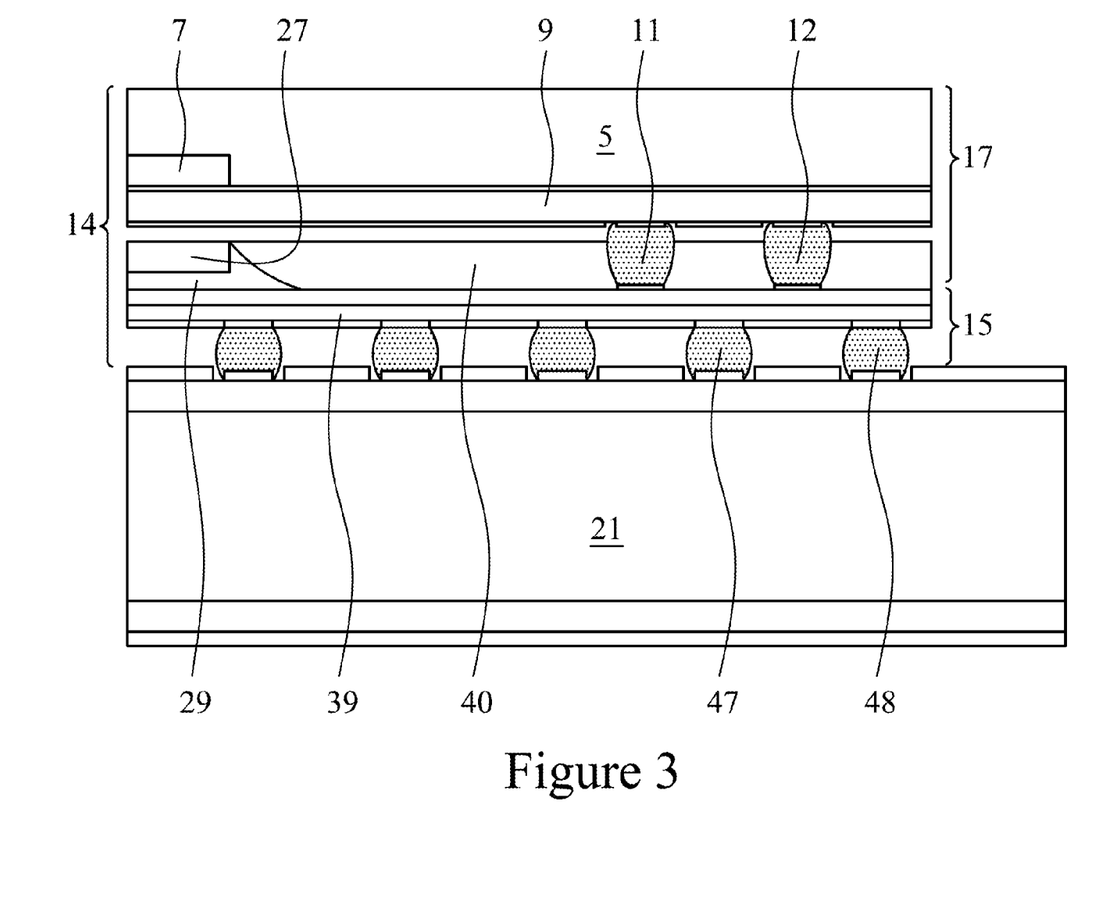
FIG. 3 depicts in a cross-sectional view an alternative embodiment PoP structure.

FIG. 3 depicts in a cross sectional view an alternative embodiment. In FIG. 3, a PoP structure 14 is shown. Most of the elements shown are the same as, and arranged in the same manner as, the embodiment of FIG. 2; and like reference numerals are therefore used in FIG. 3 for these elements.

A molded underfill layer 40 is now added to further protect the PoP connectors 11, 12 and the silicon interposer 39 from thermal and mechanical stress. This molded underfill or "MUF" layer provides additional thermal stress relief to the interposer 39, but also increases the strain on the external connectors (here, in this non-limiting example, the connectors are solder balls such as 47, 48). The use of the staggered pattern for the connectors reduces the strain by as much as 24% over a similar arrangement with a conventional PoP structure also having a MUF layer.

Figure 4:
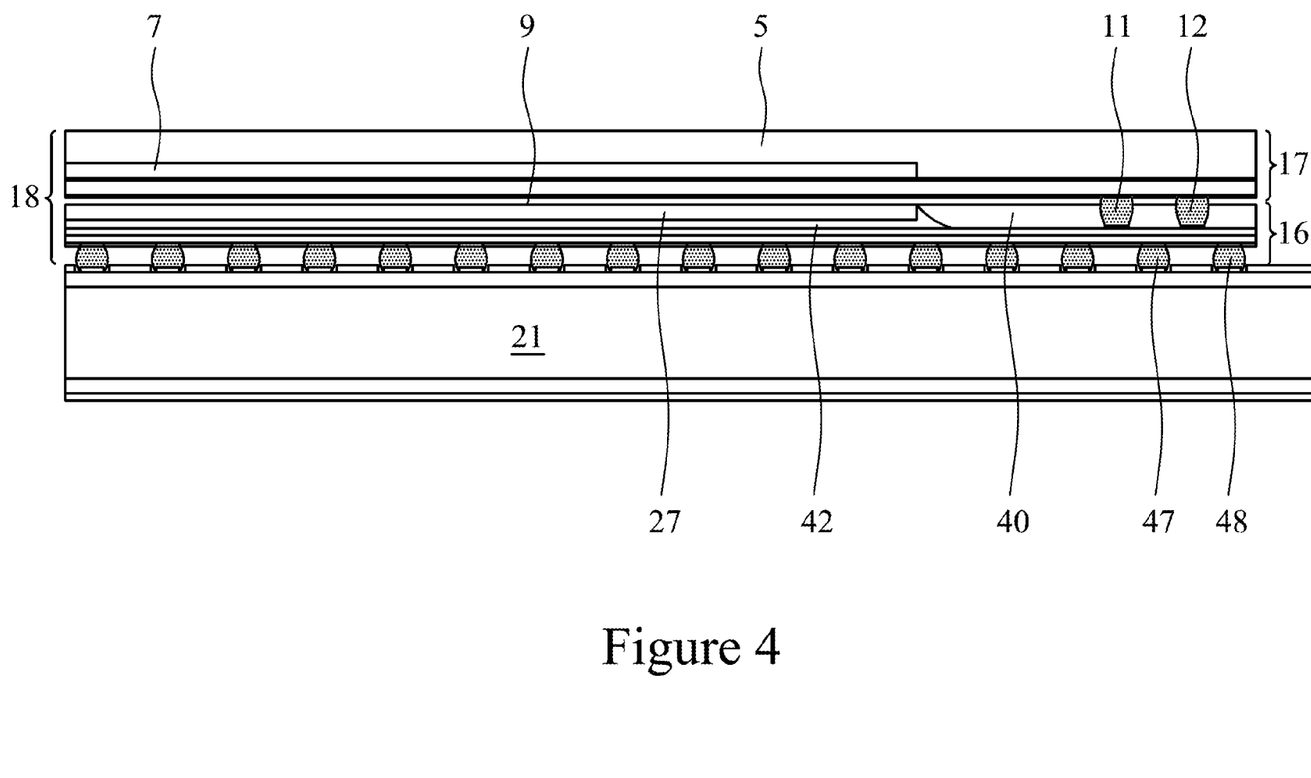
FIG. 4 depicts in a cross-sectional view another alternative embodiment PoP structure.

The embodiments of FIGS. 2 and 3 illustrate the use of a silicon interposer for the bottom packages 15 in the PoP structure. However, the embodiments are not limited to this example. In FIG. 4, the use of a different substrate such as a glass epoxy resin or PCB substrate is shown for both the upper package 17, and for the lower package, now referenced as 16, to form yet another alternative embodiment in a PoP structure 18. FIG. 4 depicts the alternative embodiment in a cross-sectional view. Several of the elements of FIG. 4 are the same as those in FIGS. 2 and 3 and like reference numerals are used for like elements. Upper package 17 is shown having one or more integrated circuits 7 mounted to substrate 9. In this example, the upper package may have several stacked integrated circuits; this arrangement is particularly useful for identical devices such as DRAM or FLASH memory integrated circuits.

A passivation layer 5 such as an overmolded layer is shown over the integrated circuits and substrate 9. Connectors 11 and 12 are arranged near the periphery of the substrate 9 and extend to connect the upper package 17 to the bottom package 16. The bottom package 4-5 16 again has an application logic integrated circuit 27 mounted on it, and in this example a capacitive underfill 29 is shown underlying the application logic integrated circuit 27. An optional molded underfill layer 40 is shown and protects the connectors 11 and 12 and the upper part of a substrate, 42. This substrate may be the same material as substrate 9, for example a glass fiber core substrate of epoxy resin, or another material for printed circuit boards. The substrate 42 may include one or more dielectric layers on both the upper and lower surfaces and copper traces may be formed with vertical via connections to provide electrical connections between the components 27, 7, and the external board connectors 47 and 48.

As in the prior embodiments, in FIG. 4 the external connectors 47 and 48 are arranged in a grid array such that these connectors are not in alignment with the PoP connectors 11 and 12 above them; and the outermost row of connectors 48 in the periphery of substrate 39 lie in an area that is outside the outermost row of PoP connectors 12 on substrate 9. So the external connectors 47 and 48 of the bottom package are again shown staggered from the PoP connectors so that the PoP connectors 11, 12 are not directly above or in alignment vertically with the external connectors 47, 48 of the bottom package 16.

This arrangement has also been shown to reduce the strain on the external connectors during TCT over the strain exhibited by the conventional arrangements. In tests the strain was reduced by as much as 50% in one test case, and by as much as 30% in another test case. The best results were obtained when the external connectors 47, 48 of the lower package were moved to be disposed in the staggered pattern and moved from their original positions outwards towards the periphery of the PoP structure, while the PoP connectors remained in the original position. Improvements were also observed if the external connectors 47, 48 remained in the original positions, and the PoP connectors 11, 12 were moved inward towards the center of the PoP structure 13 and staggered from the external connectors.

Figure 5:
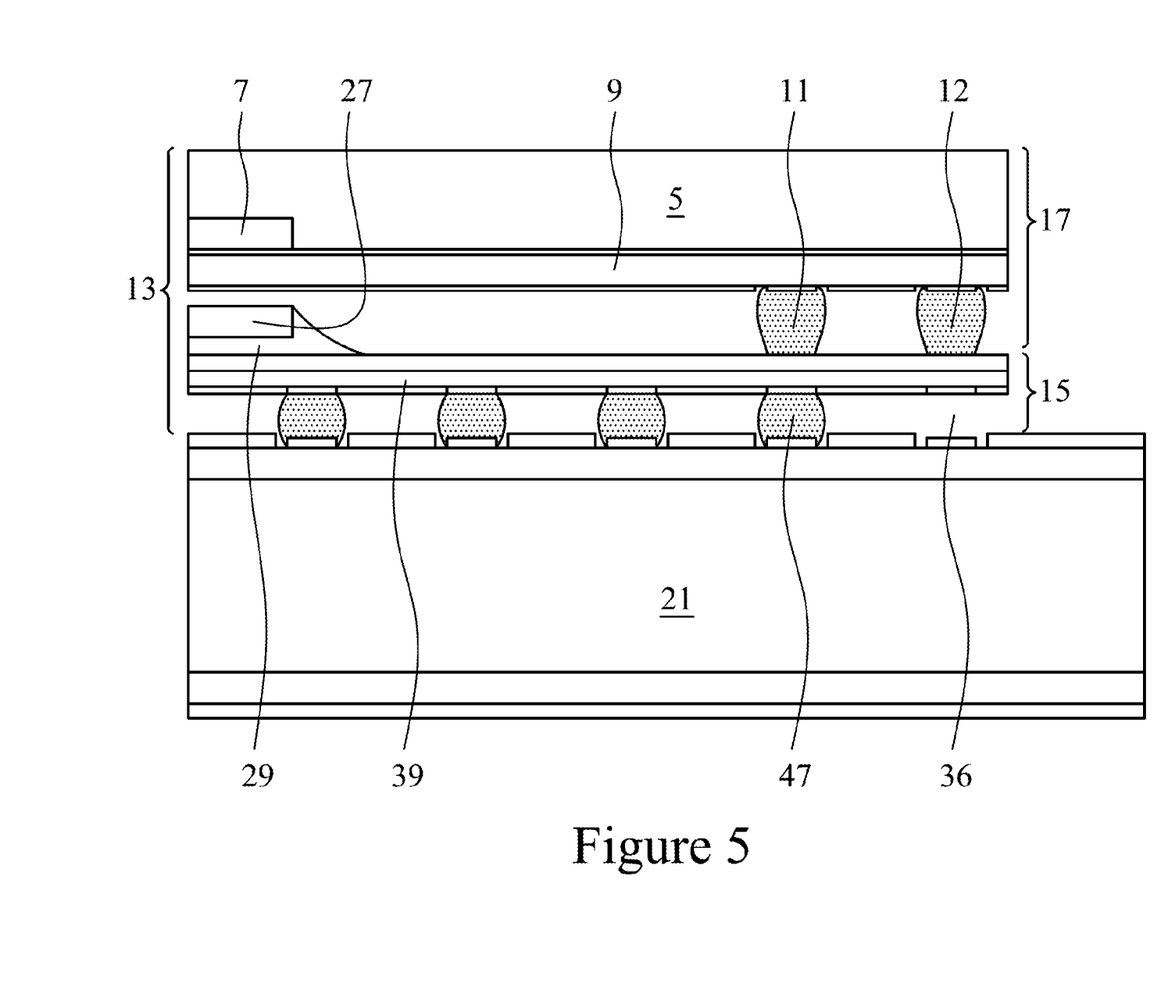
FIG. 5 depicts in a cross-sectional view yet another alternative embodiment PoP structure.

FIG. 5 depicts in a cross sectional view an alternative embodiment approach. In FIG. 4, PoP structure 13 is again provided. However instead of a staggered arrangement as in the embodiments of FIGS. 2-4, the pattern of external connectors to the system board is modified in that the corner balls are removed. The elements of FIG. 5 are mostly repeated from the above figures and like reference numerals are used again. An upper package 17 is disposed over lower package 15 in a PoP structure 13. As before the upper package 17 includes one or more integrated circuits 7 mounted on substrate 9, which may be a printed circuit board substrate. A passivation layer 5 is shown disposed over the substrate 9. As before, PoP connectors 11 and 12 are disposed in rows proximal to the periphery of the PoP structure 13, near the outer edge of substrate 9. A lower package 15 is disposed beneath the package 17 and has external connectors 37 that couple that PoP structure 13 to the circuit board 21. These connectors 47 may be, for example, solder balls and package 15 may form a BGA package. The package 15 has a substrate 39 that carries at least one integrated circuit 27, which is protected by an underfill 29.

In the embodiment of FIG. 5, the PoP connectors, solder balls 11 and 12 in this example, are in alignment with most of the external connectors, solder balls 47, of the lower package 15. This is in contrast to the embodiments above, where a staggered pattern is used. However in the embodiment of FIG. 5, the corner external connectors are removed or not formed from the BGA package 15, as shown by area 36 in the cross sectional view.

The arrangement of FIG. 5 then is an alignment pattern with the connectors that exhibit the most strain that is the corner connectors for the lower package 15, removed from the PoP structure.

Figure 6:
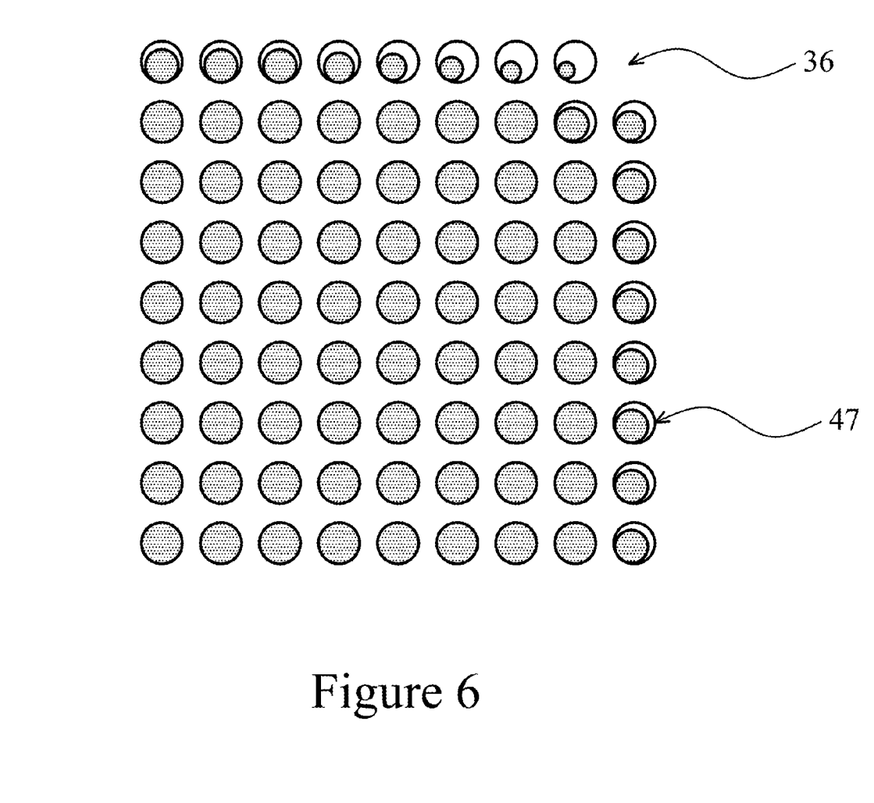
FIG. 6 depicts in a bottom view a portion of the connector pattern for the embodiment structure of FIG. 5.

FIG. 6 depicts the bottom of the substrate 15, so that a portion of the ball pattern can be seen in a bottom view. In FIG. 6 balls 47 form an array of rows and columns in a grid pattern. However, the corner position is depopulated, as shown by the area 36.

Figure 7:
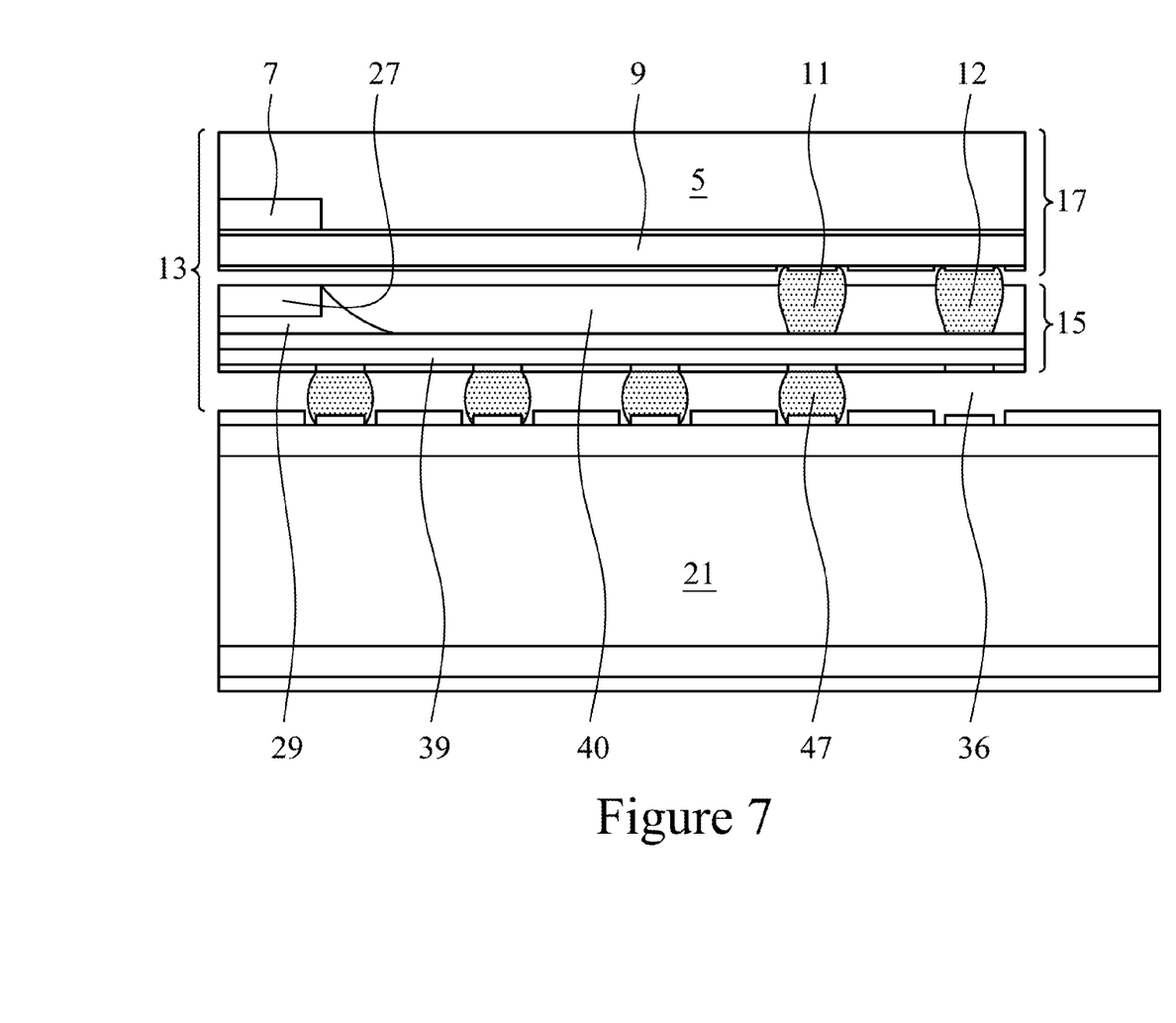
FIG. 7 depicts in a cross-sectional view another embodiment PoP structure.

The embodiments where the external connectors in the corner of the lower package 15 are removed may, in alternative embodiment, include the MUF material 40. This arrangement is depicted in cross section in FIG. 7. Again, the PoP connectors 11, 12 are shown in two rows, but the corner position has the external connector of the lower package 15 removed, as indicated by space 36. In addition, the embodiments of this arrangement are not limited to a silicon interposer as shown in FIGS. 5 and 7, but may also include a lower package formed of a printed circuit board substrate, such as an epoxy resin with glass fibers, or other substrate material.

In TCT tests, the embodiments where the corner connectors of the lower package are removed have been shown to have reduced connector strain, when compared to the known conventional approaches. In one test case with the MUF underfill over a silicon interposer, the embodiments have a maximum ball strain that is about 10% less than the prior approaches.

Figure 8:
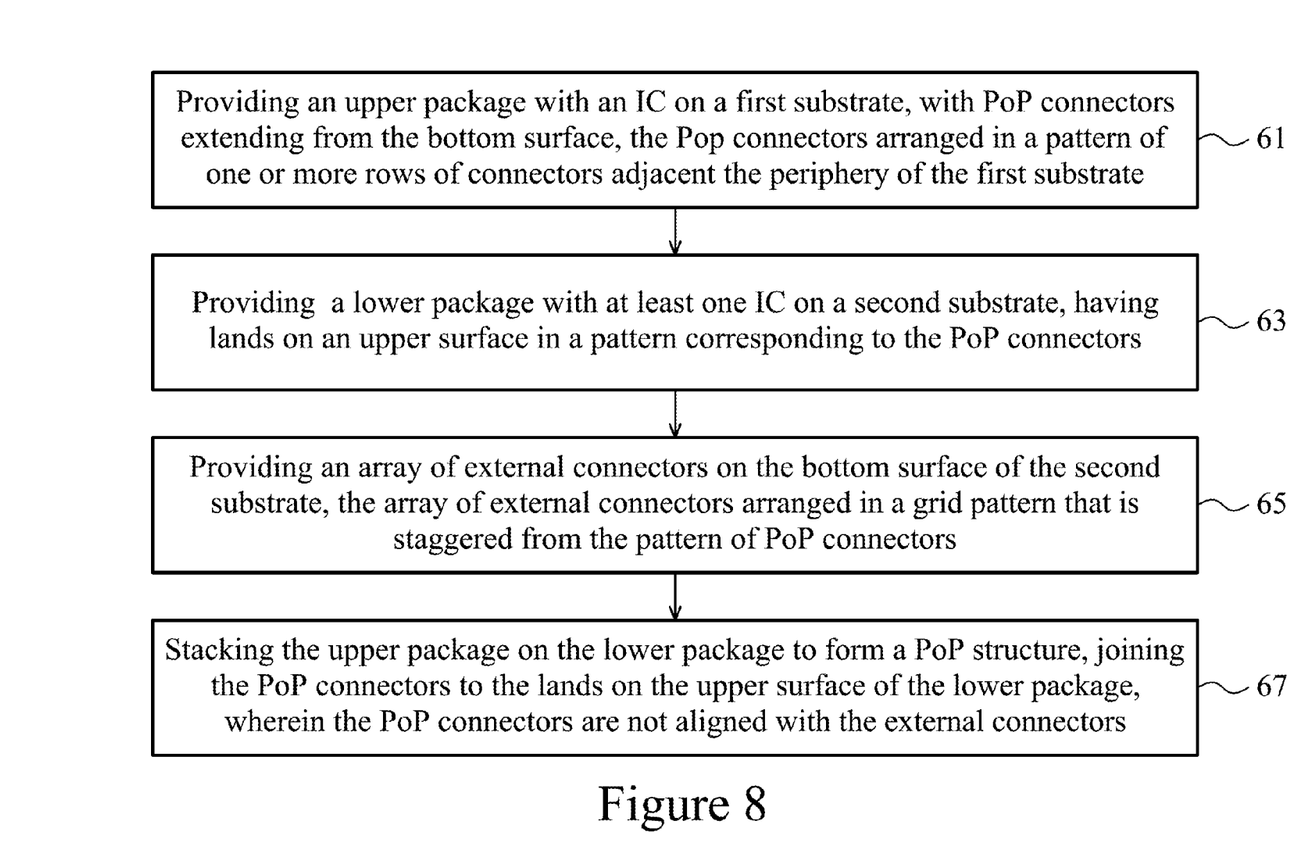
FIG. 8 depicts in a flow diagram a method embodiment.

FIG. 8 depicts in a flow diagram a method for forming a PoP structure of the embodiments. In FIG. 8, at step 61, an upper package is provided with at least one integrated circuit mounted on a first substrate, with PoP connectors extending from the bottom surface, the connectors are arranged in a pattern of one or more rows of connectors proximal to the peripheral edge of the first substrate. In step 63, a lower package is provided with at least one integrated circuit mounted to a second substrate, having lands or pads on an upper surface of the second substrate that corresponds to the PoP connectors.

In step 65, an array of external connectors is provided on the bottom surface of the second substrate, the array of external connectors arranged in grid pattern that is staggered from the pattern of the package on package connectors of the upper package. This may be done, for example, by using a constant ball to ball pitch for both the package on package connectors of the first package, and the external connectors of the second package, and offsetting the pattern of the external connectors by a half-pitch distance so that the two patterns are staggered relative to one another.

In step 67, the upper package is stacked on the lower package, wherein none of the package to package connectors are positioned directly over any of the external connectors (not in vertical alignment.) Other arrangements could be used to stagger the patterns as well, so that the package on package connectors are not in vertical alignment with the external connectors.

Figure 9:
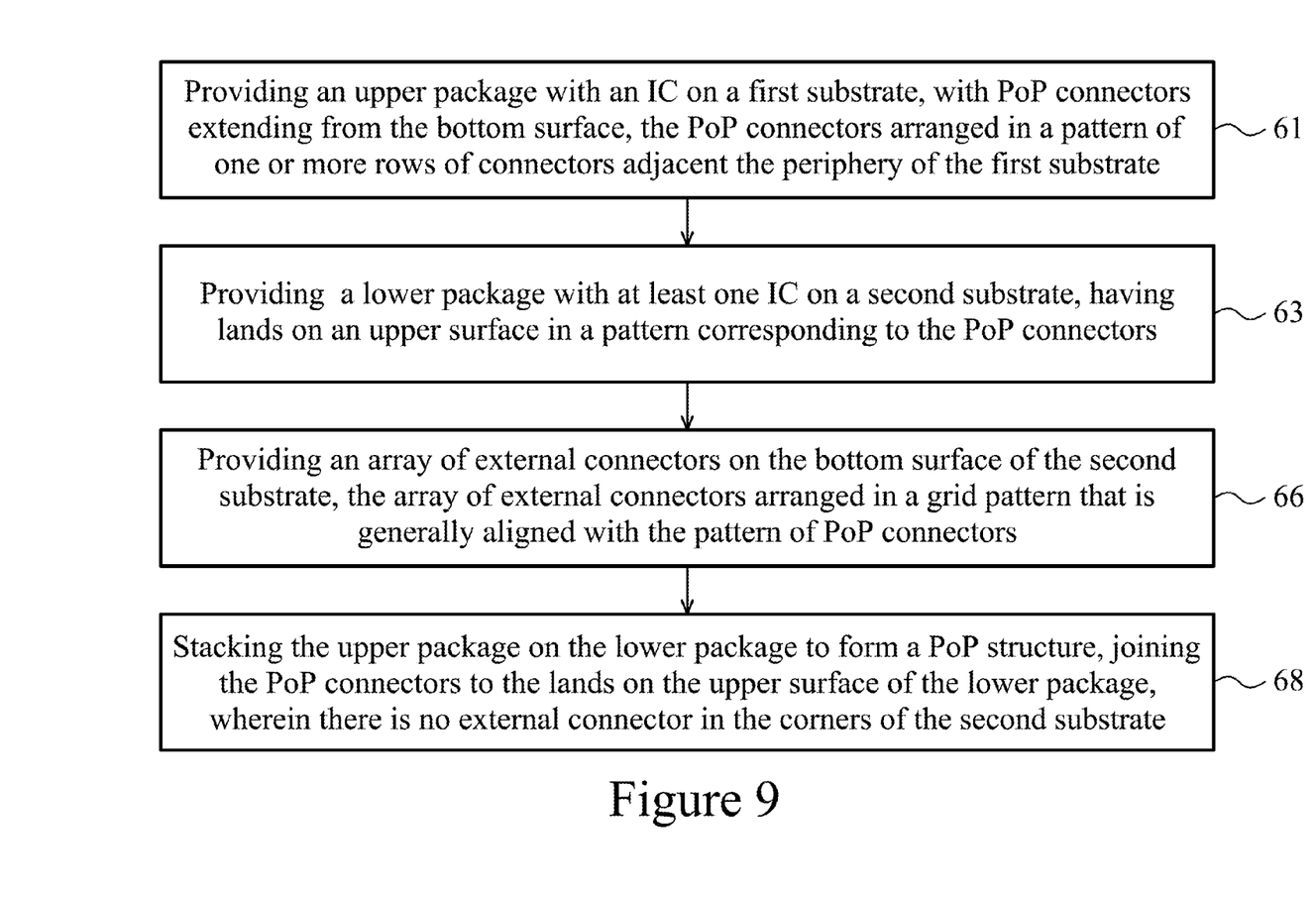
FIG. 9 depicts in a flow diagram an alternative method embodiment.

FIG. 9 depicts in a flow diagram the steps for forming a PoP structure using the embodiments where the corner connectors are removed from the array of external connectors. In step 61, the upper package is provided with at least one IC on a first substrate, the PoP connectors extending from the bottom of the first substrate and the PoP connectors extending from the bottom surface of the first substrate in a pattern or one or more rows near the periphery of the first substrate.

In step 63, which is the same as for FIG. 8, the lower package is provided having an IC mounted on a second substrate, with lands on the upper surface of the lower package arranged in correspondence with the pattern of the PoP connectors.

In step 66, an array of external connectors is provided on the bottom surface of the second substrate, the array of external connectors arranged in a grid pattern that is generally aligned with the pattern of the PoP connectors.

In step 68, the upper package is stacked onto the lower package to form a PoP structure, however in the pattern of the external connectors, the corner connectors are removed so that there is no external connector in the corners of the second substrate.

Use of the embodiments reduces the strain observed in the external connectors for both the staggered pattern embodiments, and the removed corner connector embodiments, for thermal cycle testing. Further, drop tests of test vehicle devices using the embodiments were conducted and compared to drop test results for PoP structures using the conventional arrangements. Observed strain from the drop tests was reduced for all of the embodiments described above. Use of the embodiments advantageously reduces TCT strain and drop test strain in the PoP structures with minimal modification and at no additional costs.

In an example embodiment, a semiconductor device structure includes a first integrated circuit package comprising at least one integrated circuit device mounted on a first substrate, and having a plurality of package on package connectors extending from a bottom surface of the first substrate and arranged in a pattern of one or more rows proximal to an outer periphery of the first substrate; and a second integrated circuit package including at least another integrated circuit device mounted on a second substrate, the second substrate including a plurality of lands on an upper surface of the second substrate coupled to the plurality of package on package connectors, and a plurality of external connectors extending from a bottom surface of the second integrated circuit package, the plurality of external connectors arranged in a grid pattern; wherein the pattern of the external connectors is staggered from the pattern of the package on package connectors so that the package on package connectors are not in vertical alignment with the external connectors.

In a further embodiment, the semiconductor device structure is provided wherein the plurality of package on package connectors is solder balls. In still another embodiment, the semiconductor device structure includes wherein the plurality of external connectors is solder balls.

In another embodiment, the semiconductor device structure is provided, wherein the second substrate is a silicon interposer. In still a further embodiment, the semiconductor device structure further includes a molded underfill layer on the upper surface of the second substrate.

In another embodiment, the semiconductor device structure is provided wherein the first and second substrates are printed circuit board material. In yet another embodiment, the semiconductor device structure is provided and the at least one integrated circuit device is a memory device. In still another embodiment, the semiconductor device structure is provided, wherein the at least another integrated circuit device is a microprocessor.

In still a further embodiment, the semiconductor device structure is provided and the second substrate is a silicon interposer and an underfill material is disposed between the at least another integrated circuit device and the silicon interposer.

In another embodiment, a semiconductor device structure includes a first integrated circuit package including at least one integrated circuit device mounted on a first substrate, and a plurality of package on package connectors extending from a bottom surface of the first substrate and arranged in a pattern of one or more rows proximal to an outer periphery of the first substrate; and a second integrated circuit package including at least another integrated circuit device mounted on a second substrate, a plurality of lands on an upper surface of the second substrate coupled to the plurality of package on package connectors, and further includes a plurality of external connectors extending from a bottom surface of the second integrated circuit package, the plurality of external connectors arranged in a grid pattern; wherein the pattern of the external connectors is in alignment with the pattern of the package on package connectors but the pattern of the external connectors is free from external connectors in the corners of the second substrate.

In another embodiment, the semiconductor device structure free from corner connectors is provided wherein the plurality of package on package connectors is solder balls. In still a further embodiment, the plurality of external connectors is solder balls. In yet another embodiment, the second substrate is a silicon interposer. In still a further embodiment, the semiconductor device structure free from corner connectors includes a molded underfill layer on the upper surface of the second substrate. In yet another embodiment, the first and second substrates are printed circuit board material. In still a further embodiment a molded underfill material is disposed over the upper surface of the second substrate. In yet another embodiment, the plurality of package on package connectors and the plurality of external connectors is solder balls.

In still another embodiment, a method includes providing a first integrated circuit package including one or more integrated circuits on an upper surface of a first substrate, and providing a plurality of package on package connectors extending from a lower surface of the first substrate, the plurality of package on package connectors arranged in one or more rows proximal to an outer periphery of the first substrate in a first pattern; and providing a second integrated circuit package including one or more other integrated circuits on an upper surface of a second substrate, the second substrate including a plurality of lands on an upper surface of the second substrate arranged in correspondence to the first pattern for receiving the plurality of package on package connectors, and further providing a plurality of external connectors extending from a bottom surface of the second substrate and arranged in a second pattern that is a grid pattern of external connectors; and mounting the first integrated circuit package to the upper surface of the second integrated circuit package, bonding the package on package connectors of the first integrated circuit package to the plurality of lands on the second substrate; wherein the second pattern is staggered from the first pattern so that the plurality of package on package connectors is not in vertical alignment with the plurality of external connectors.

In a further embodiment, the external connectors in the second pattern are arranged such that outermost connectors of the external connectors are adjacent a periphery of the second substrate and are disposed outside a peripheral area defined by the rows of the plurality of package on package connectors. In still another embodiment the method includes providing the package on package connectors and providing the external connectors as solder balls.

The scope of the present application is not intended to be limited to the particular illustrative embodiments of the structures, methods and steps described in the specification. As one of ordinary skill in the art will readily appreciate from the disclosure of the example embodiments, processes, or steps, presently existing or later to be developed, that perform substantially the same function or achieve substantially the same result as the corresponding embodiments described herein may be utilized and these alternatives are contemplated as part of the embodiments. Accordingly, the appended claims are intended to include within their scope such processes or steps.

What is claimed is:

1. A semiconductor device structure, comprising:
a first integrated circuit package comprising at least one integrated circuit device mounted on a first substrate, the first integrated circuit package having a plurality of package on package connectors extending outwards from a bottom surface of the first substrate and arranged in a pattern of one or more rows proximal to an outer periphery of the first substrate; and
a second integrated circuit package comprising at least another integrated circuit device mounted on a second substrate, the second substrate comprising a plurality of lands on an upper surface of the second substrate coupled to the plurality of package on package connectors, the second integrated circuit package comprising a plurality of external connectors extending from a bottom surface of the second integrated circuit package, the plurality of external connectors arranged in a grid pattern;
wherein the pattern of the external connectors is staggered from the pattern of the package on package connectors so that the package on package connectors are not in vertical alignment with the external connectors.

2. The semiconductor device structure of claim 1, wherein the plurality of package on package connectors comprises solder.

3. The semiconductor device structure of claim 1, wherein the plurality of external connectors comprises solder.

4. The semiconductor device structure of claim 1, wherein the second substrate is a silicon interposer.

5. The semiconductor device structure of claim 1, further comprising a molded underfill layer on the upper surface of the second substrate.

6. The semiconductor device structure of claim 1, wherein the first and second substrates are printed circuit boards.

7. The semiconductor device structure of claim 1, wherein the at least one integrated circuit device is a memory device.

8. The semiconductor device structure of claim 1, wherein the at least another integrated circuit device is a microprocessor.

9. The semiconductor device structure of claim 1, wherein the second substrate is a silicon interposer and an underfill material is disposed between the at least another integrated circuit device and the silicon interposer.

10. The semiconductor device structure of claim 1, wherein an outermost row of the plurality of external connectors lies outside an area of plurality of package on package connectors.

11. The semiconductor device structure of claim 1, wherein the plurality of package on package connectors contacts the plurality of lands.

12. A semiconductor device structure, comprising:
a first integrated circuit package comprising at least one integrated circuit device mounted on a first substrate, the first integrated circuit package having a plurality of package on package connectors extending outwards from a bottom surface of the first substrate and arranged in a pattern of one or more rows proximal to an outer periphery of the first substrate; and
a second integrated circuit package comprising at least another integrated circuit device mounted on a second substrate, the second substrate comprising a plurality of lands on an upper surface of the second substrate coupled to the plurality of package on package connectors, the second integrated circuit package further comprising a plurality of external connectors extending from a bottom surface of the second integrated circuit package, the plurality of external connectors arranged in a grid pattern;
wherein the pattern of the external connectors is in alignment with the pattern of the package on package connectors but the pattern of the external connectors is free from external connectors in corners of the second substrate.

13. The semiconductor device structure of claim 12, wherein the plurality of package on package connectors comprises solder.

14. The semiconductor device structure of claim 12, wherein the plurality of external connectors comprises solder.

15. The semiconductor device structure of claim 12, wherein the second substrate is a silicon interposer.

16. The semiconductor device structure of claim 15, further comprising a molded underfill layer on the upper surface of the second substrate.

17. The semiconductor device structure of claim 12, wherein the first and second substrates are printed circuit board material.

18. The semiconductor device of claim 17, further comprising a molded underfill material over the upper surface of the second substrate.

19. The semiconductor device of claim 12, wherein the plurality of package on package connectors and the plurality of external connectors comprises solder balls.

20. The semiconductor device structure of claim 12, wherein the plurality of package on package connectors contacts the plurality of lands.

* * * * *

UNITED STATES PATENT AND TRADEMARK OFFICE
CERTIFICATE OF CORRECTION

PATENT NO.         : 8,680,663 B2                                      Page 1 of 1
APPLICATION NO.    : 13/342751
DATED              : March 25, 2014
INVENTOR(S)        : Yu-Feng Chen et al.

It is certified that error appears in the above-identified patent and that said Letters Patent is hereby corrected as shown below:

In the Specification:

In Col. 4, line 58, Detailed Description, after "The bottom package" delete "4-5".

Signed and Sealed this
Twenty-seventh Day of May, 2014

Michelle K. Lee
*Deputy Director of the United States Patent and Trademark Office*